(12) United States Patent  (10) Patent No.: US 7,761,835 B2
Kitano et al.  (45) Date of Patent: Jul. 20, 2010

(54) SEMICONDUCTOR DEVICE DESIGN METHOD, SEMICONDUCTOR DEVICE DESIGN SYSTEM, AND COMPUTER PROGRAM FOR EXTRACTING PARASITIC PARAMETERS

(75) Inventors: Tomohiro Kitano, Tokyo (JP); Hisayuki Nagamine, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 195 days.

(21) Appl. No.: 11/953,184

(22) Filed: Dec. 10, 2007

(65) Prior Publication Data

US 2008/0141197 A1   Jun. 12, 2008

(30) Foreign Application Priority Data

Dec. 11, 2006  (JP)  .............................. 2006-332938
Nov. 21, 2007  (JP)  .............................. 2007-302106

(51) Int. Cl.
  *G06F 17/50*  (2006.01)
(52) U.S. Cl. ................... 716/11; 716/8; 716/9; 716/10; 716/19; 716/20; 716/21; 703/14
(58) Field of Classification Search ............... 716/8–11, 716/19–21; 703/14
See application file for complete search history.

(56) References Cited

U.S. PATENT DOCUMENTS

| 6,175,947 | B1* | 1/2001 | Ponnapalli et al. | 716/5 |
| 6,182,269 | B1* | 1/2001 | Laubhan | 716/5 |
| 2003/0069722 | A1* | 4/2003 | Beattie et al. | 703/14 |
| 2005/0125751 | A1* | 6/2005 | Miller et al. | 716/4 |
| 2007/0174801 | A1* | 7/2007 | Park et al. | 716/8 |

FOREIGN PATENT DOCUMENTS

| JP | 07-262257 | 10/1995 |
| JP | 08-320888 | 12/1996 |

(Continued)

OTHER PUBLICATIONS

Hideki Shibata—"Challenge and Vision of Multilayer Wiring Technology towards Quartermicron Generation", Journal of the Institute of Electronics Communication Engineering C-II, Institute of Electronics and Communication Engineering Incorporated, May 25, 1995, vol. J78-C-2, No. 5, p. 165 to 176.

(Continued)

*Primary Examiner*—Naum B Levin
(74) *Attorney, Agent, or Firm*—Young & Thompson

(57) ABSTRACT

A design method of a semiconductor device is provided with a mask region setting step of setting a mask region to a layout of the semiconductor device, a parasitic parameter changing step of setting parasitic parameters of a wiring part within the mask region to zero, and a parasitic parameter extraction step of extracting parasitic parameters of either the total layout or a specific part of the layout. The parasitic parameter changing step includes a virtual wiring layer generation step of generating a virtual wiring layer corresponding to the actual wiring layer of the semiconductor device, a parasitic parameter definition step of defining the parasitic parameters of the virtual wiring layer as zero, and a wiring layer conversion step of converting the wiring part within the mask region of the wiring of the actual wiring layer, to the wiring part of the virtual wiring layer.

5 Claims, 6 Drawing Sheets

FOREIGN PATENT DOCUMENTS

| | | |
|---|---|---|
| JP | 11-265941 | 9/1999 |
| JP | 11-274306 | 10/1999 |
| JP | 11-353340 | 12/1999 |
| JP | 2001-035925 | 2/2001 |
| JP | 2004-070473 | 3/2004 |
| JP | 2004-110627 | 4/2004 |
| JP | 2005-182632 | 7/2005 |
| JP | 2006-209702 | 8/2006 |

OTHER PUBLICATIONS

Japanese Official Action.

* cited by examiner

SEMICONDUCTOR DEVICE DESIGN METHOD, SEMICONDUCTOR DEVICE DESIGN SYSTEM, AND COMPUTER PROGRAM FOR EXTRACTING PARASITIC PARAMETERS

TECHNICAL FIELD

The present invention relates to a semiconductor device design method, a semiconductor device design system, and a computer program, and, more particularly to a method, a system, and a computer program suitable for a layout design and verification of a miniaturized product.

BACKGROUND OF THE INVENTION

In the design of a semiconductor device using a computer (CAD system), a layout design is performed based on a netlist (information indicating a connection relationship of logic elements), after logic design of designing a logic circuit of a gate level is performed. When the layout is determined, various verifications are performed regarding whether the layout satisfies a design rule and whether a device having the layout normally operates. As one of processes performed in the verification process, LPE (Layout Parameter Extraction) has been known (see Japanese Patent Application Laid-open No. 2006-209702).

In the LPE, parasitic resistance and parasitic capacitance (hereinafter, "parasitic parameters") concerning wiring in the obtained layout are extracted. The parasitic parameters can be determined for the first time after the layout is obtained, and are not contained in the above netlist. The extracted parasitic parameters are added to the above netlist, and, as a result, the netlist added with the parasitic parameters (hereinafter, a "netlist having parasitic parameters") is generated. In other words, the netlist having parasitic parameters can be obtained, by inputting the netlist and the layout data to a tool that executes the LPE (LPE tool).

Thereafter, delay verification and timing verification of the device which is being designed are performed using the obtained netlist having parasitic parameters. When results of these verifications are "fail", the layout design process is executed again. The LPE processing is then executed again, and verifications are executed again. The above operation is repeated until when the layout "passes" the verifications. When the results of the verifications "pass", final layout data is determined.

There are also other various techniques concerning the layout design. For example, Japanese Patent Application Laid-open No. H11-265941 discloses a method of decreasing design cost by shortening the LSI design time, in designing the LSI having circuits of mutually different signal amplitudes mounted in the same chip. In this method, LEF information is data-converted from an actual wiring layer or a terminal layer of the chip and each function block to a virtual wiring layer of an independent definition. Wiring is performed automatically in the virtual wiring layer based on the converted information and circuit connection information. This automatic wiring information is data-converted to the actual wiring layer or the terminal layer, thereby decreasing the number of times of the automatic wiring.

In a semiconductor device, a miniaturized product of an existing product is often designed. In this case, the layout of a part requiring a correction is designed in concentration, while following the layout of the existing product. Therefore, efficient layout design can be performed.

However, the LPE processing of the layout of the miniaturized product cannot be performed until after the layout data of the miniaturized product is created anew. As described above, the LPE is the processing of extracting parasitic parameters, and the parasitic parameters can be determined only after obtaining the layout. Therefore, even when a miniaturized product is attempted to be designed based on the layout of the existing product, parasitic capacitance and parasitic resistance for performing the delay verification and the timing verification cannot be extracted, until after the layout data is designed. In other words, according to the conventional design method, the parasitic parameters already obtained in the layout of the existing product cannot be used, and it takes time from the layout designing to the passing of the verifications due to the increase in the number of repetition of designing. As a result, the designing is inefficient.

SUMMARY OF THE INVENTION

It is therefore an object of the present invention to provide a design method of a semiconductor device capable of efficiently designing a miniaturized product of an existing product, using a layout of the existing product, without performing a new designing of a layout of the miniaturized product.

Another object of the present invention is to provide a semiconductor device design system that realizes the design method of a semiconductor device to achieve the above object.

Still another object of the present invention is to provide a computer program that realizes by computer the semiconductor device design system to achieve the above object.

The objects of the present invention can be accomplished by a design method of a semiconductor device including a mask region setting step of setting a mask region to a layout of the semiconductor device, a parasitic parameter changing step of setting parasitic parameters of a wiring part within the mask region to zero, and a parasitic parameter extraction step of extracting parasitic parameters of either the total layout or a specific part of the layout.

According to the present invention, in extracting the parasitic parameters of the layout of the miniaturized product using the layout data of the existing product, the mask region is assigned on the layout screen, and the parasitic parameters of the wiring part within the mask region are set to zero. With this arrangement, the parasitic parameters of the layout of the miniaturized product can be extracted, without setting a new layout of the miniaturized product. Therefore, the period required for the layout design and verification can be shortened.

In the present invention, the parasitic parameter changing step preferably includes a virtual wiring layer generation step of generating a virtual wiring layer corresponding to the actual wiring layer of the semiconductor device, a parasitic parameter definition step of defining the parasitic parameters of the virtual wiring layer as zero, and a wiring layer conversion step of converting the wiring part within the mask region of the wiring of the actual wiring layer, to the wiring part of the virtual wiring layer. In this case, the parasitic parameter changing step preferably includes a wiring length correction step of extending the wiring part of the virtual wiring layer by a predetermined length, a wiring regeneration step of connecting the end of the wiring part of the virtual wiring layer with the end of a disconnected wiring of the actual wiring layer with a virtual contact plug, thereby providing a continuous wiring, and a defining step of defining the parasitic parameters of the virtual contact plug as zero.

Usually, the parasitic parameters are defined for each wiring layer. Therefore, mutually different parasitic parameters cannot be defined in different planar regions within the same wiring layer. However, the parasitic capacitance and the parasitic resistance of the wiring part in a specific region of the actual wiring layer can be handled as zero, by defining a new virtual wiring layer separately from the actual wiring layer, and by setting the parasitic capacitance and the parasitic resistance of this virtual wiring layer to zero.

In the present invention, at the virtual wiring layer generation step, when plural actual wiring layers are present, it is preferable to generate plural virtual wiring layers corresponding to the respective actual wiring layers. With this arrangement, the handling of the wiring part before and after the conversion can be facilitated.

The above objects of the present invention can be also accomplished by a semiconductor device design system which includes: a layout edit tool for editing the layout data of the semiconductor device; and a parasitic parameter extraction tool for extracting parasitic parameters of either a total layout or a specific part of the layout of the semiconductor device, wherein the layout edit tool includes a mask region setting unit that sets a mask region on the layout of the semiconductor device, and a parasitic parameter changing unit that sets the parasitic parameters of a wiring part within the mask region to zero.

The above objects of the present invention can be also accomplished by a computer program which makes a computer execute which includes a mask region setting step of setting a mask region on a layout of a semiconductor device, a parasitic parameter changing step of setting parasitic parameters of a wiring part within the mask region to zero, and a parasitic parameter extraction step of extracting parasitic parameters of either the total layout or a specific part of the layout.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be described in detail hereinafter with reference to the accompanying drawings.

Figure 1A:
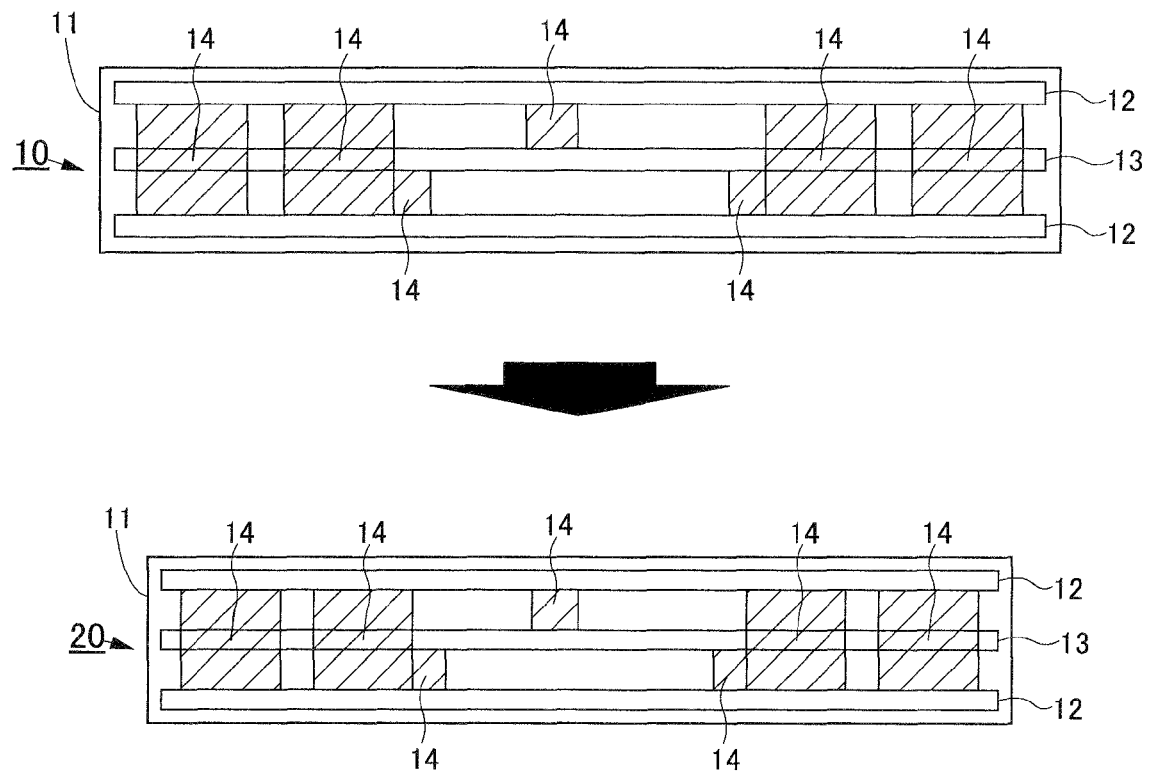
FIGS. 1A and 1B are schematic diagrams for explaining a design method of a semiconductor device according to an embodiment of the present invention, showing a planar layout of the semiconductor device.
Figure 1B:
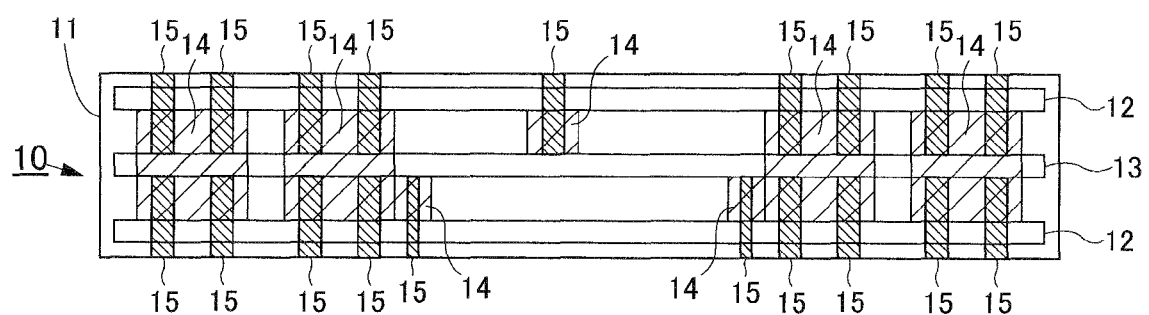

FIGS. 1A and 1B are schematic diagrams for explaining a design method of a semiconductor device according to an embodiment of the present invention, showing a planar layout of the semiconductor device.

As shown in FIG. 1A, designing a layout 20 of a semiconductor device of a miniaturized product (for example, 0.10 μm process) is considered, based on a layout 10 of a semiconductor device of an existing product (for example, 0.13 μm process). In the layouts 10 and 20 of the semiconductor devices shown in FIG. 1A, functional blocks and wirings for electrically connecting between the functional blocks are laid out on a semiconductor substrate 11. The wirings include a signal line, a power source line, and a ground line. The wirings employ a multilayer wiring structure having metal wirings piled up in many layers. In the present embodiment, a region 12 provided along a longitudinal direction of the semiconductor substrate 11 is a bus line region, and a region 13 is a pad layout region. A region 14 indicated by oblique lines expresses a miniaturized portion according to a layout change.

In the design of the miniaturized product, in extracting parasitic capacitance and parasitic resistance of either the total layout or a specific part of the layout of the miniaturized product, mask regions 15 are set on the layout 10 of the semiconductor device of the existing product as shown in FIG. 1B, and a layout equivalent to that of the miniaturized product is achieved, by regarding the parasitic capacitance and the parasitic resistance of the wiring within the mask regions 15 as zero.

Figure 2:
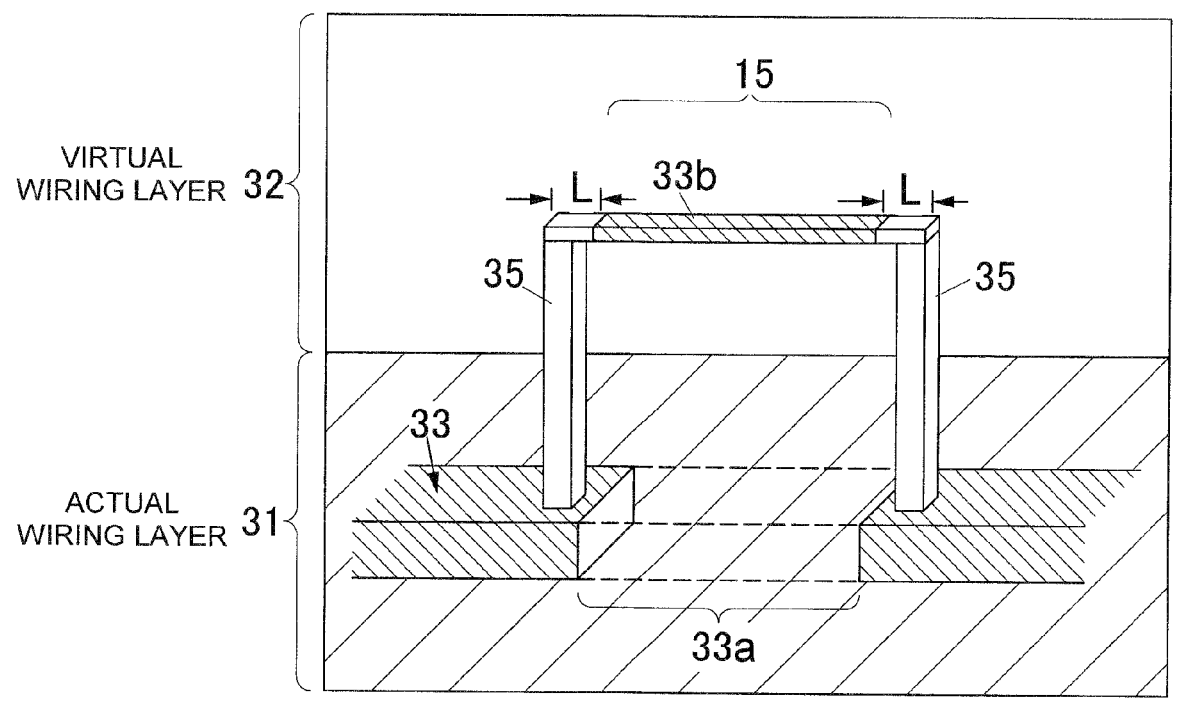
FIG. 2 is a schematic diagram for explaining a method of regarding parasitic capacitance and parasitic resistance of a wiring within mask regions as zero.

FIG. 2 is a schematic diagram for explaining a method of regarding the parasitic capacitance and the parasitic resistance of the wiring within the mask regions 15 as zero.

As shown in FIG. 2, according to this method, a virtual wiring layer 32 is prepared separately from an actual metal wiring layer (actual wiring layer) 31. In this case, both a dielectric constant $\in$ and specific resistivity p of the wiring within the virtual wiring layer 32 are defined as zero. Thereafter, out of a metal wiring 33 of the actual wiring layer 31, a wiring part 33$a$ within the mask region 15 is converted to a wiring part 33$b$ of the virtual wiring layer 32. Both ends of the wiring part 33$b$ are extended by a predetermined length L, respectively. Further both ends of the wiring part 33$b$ are connected to ends of the disconnected parts of the metal wiring 33 of the actual wiring layer 31, via a minimum-size virtual contact plug 35. As a result, the wiring of the actual wiring layer 31 is converted to the wiring via the virtual wiring layer 32.

Usually, on the LPE tool, parasitic parameters are defined for each wiring layer, and the parasitic parameters of the wiring have the same values within the same layer. In other words, mutually different parasitic parameters cannot be defined in different planar regions within the same wiring layer. However, the parasitic capacitance and the parasitic resistance of the wiring part within a specific region, i.e., the mask region 15, of the actual wiring layer can be handled as zero, by defining a new virtual wiring layer separately from the actual wiring layer, and by setting the parasitic capacitance and the parasitic resistance of the virtual wiring layer to zero.

Figure 3:
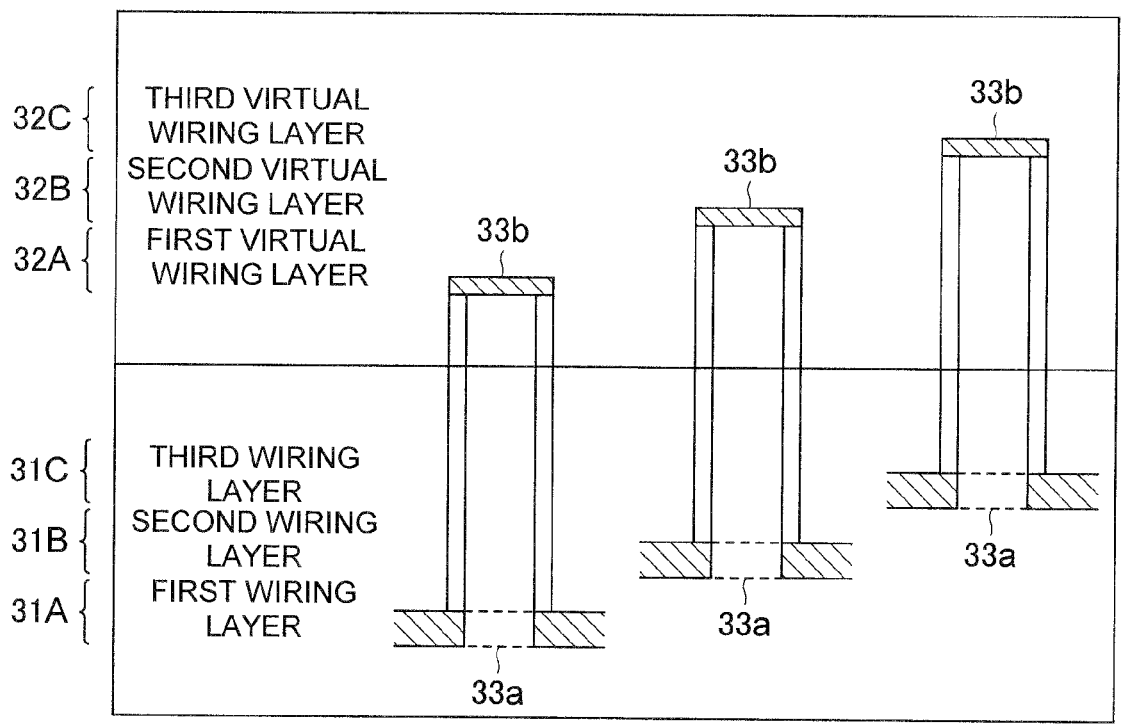
FIG. 3 is a schematic diagram for explaining a multilayer wiring structure.

FIG. 3 is a schematic diagram for explaining the design method of a semiconductor device according to the embodiment applying to a multilayer wiring structure.

As shown in FIG. 3, when plural actual wiring layers are present, virtual wiring layers of the same number as that of the actual wiring layers are prepared. For example, when the actual wiring layer includes first to third wiring layers 31A, 31B, 31C, first to third virtual wiring layers 32A, 32B, 32C are prepared. The wiring part 33a of the first wiring layer 31A is converted to the wiring part 33b of the first virtual wiring layer 32A. The wiring part 33a of the second wiring layer 31B is converted to the wiring part 33b of the second virtual wiring layer 32B. The wiring part 33a of the third wiring layer 31C is converted to the wiring part 33b of the third virtual wiring layer 32C. Accordingly, the handling of the wiring parts before and after the conversion can be facilitated.

Figure 4A:
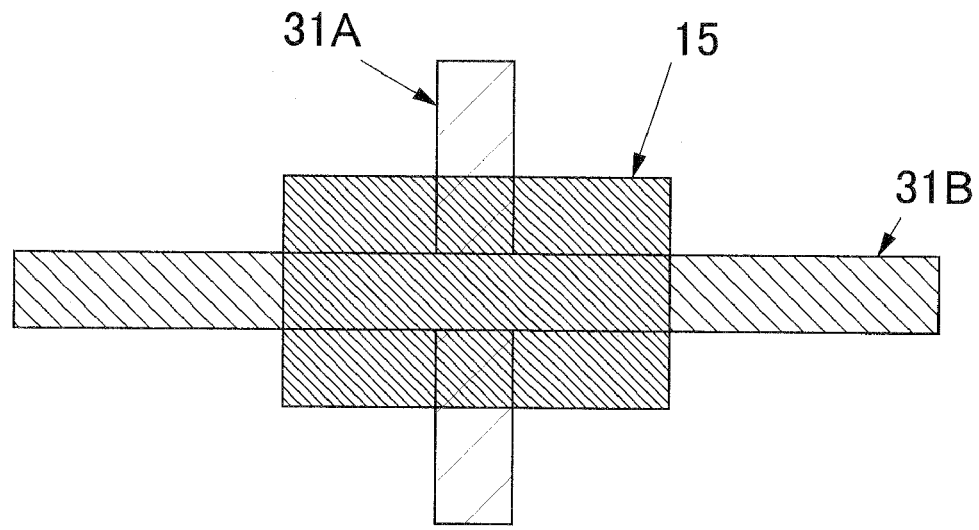
FIGS. 4A and 4B are schematic diagrams for explaining intersection between wirings within different actual wiring layers.
Figure 4B:
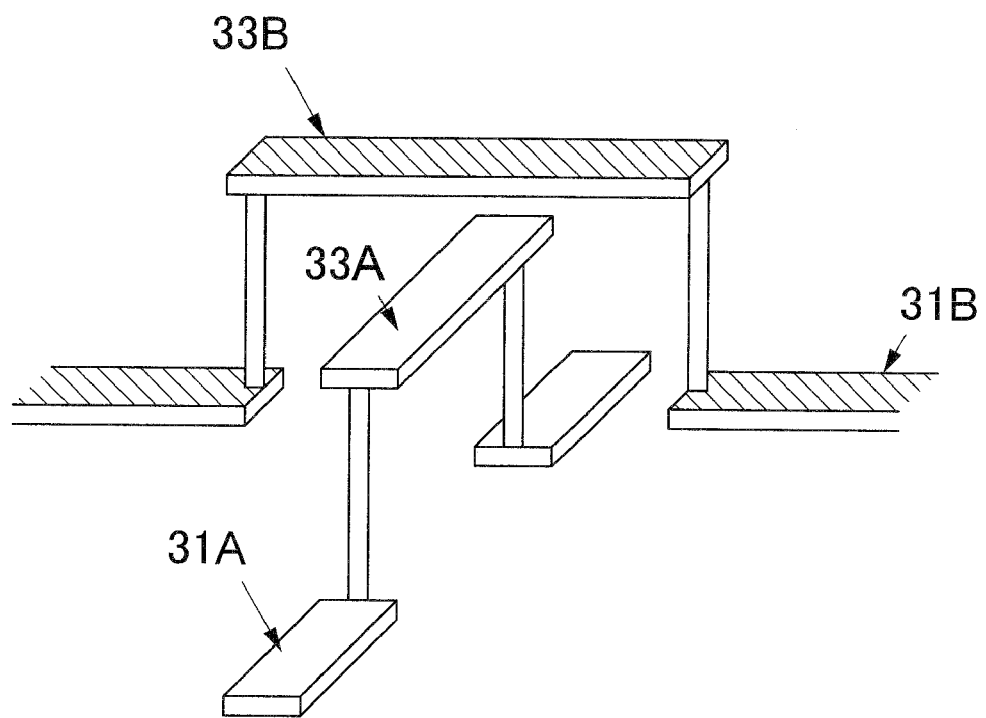

FIGS. 4A and 4B are schematic diagrams for explaining intersection between wirings within different actual wiring layers.

As shown in FIGS. 4A and 4B, even when the wiring within the first wiring layer 31A intersects with the wiring within the second wiring layer 31B, this has no problem. The wiring part 33a of the first wiring layer 31A is converted to the wiring part 33b of a first virtual wiring layer 33A. The wiring part of the second wiring layer 31B is converted to the wiring part 33b of a second virtual wiring layer 33B. Accordingly, a relationship of the intersection between the wiring parts 33a and 33a, that is, a positional relationship in the actual wiring layer is also maintained in the virtual wiring layer after the conversion.

A system that specifically achieves the above design method is explained in detail below.

Figure 5:
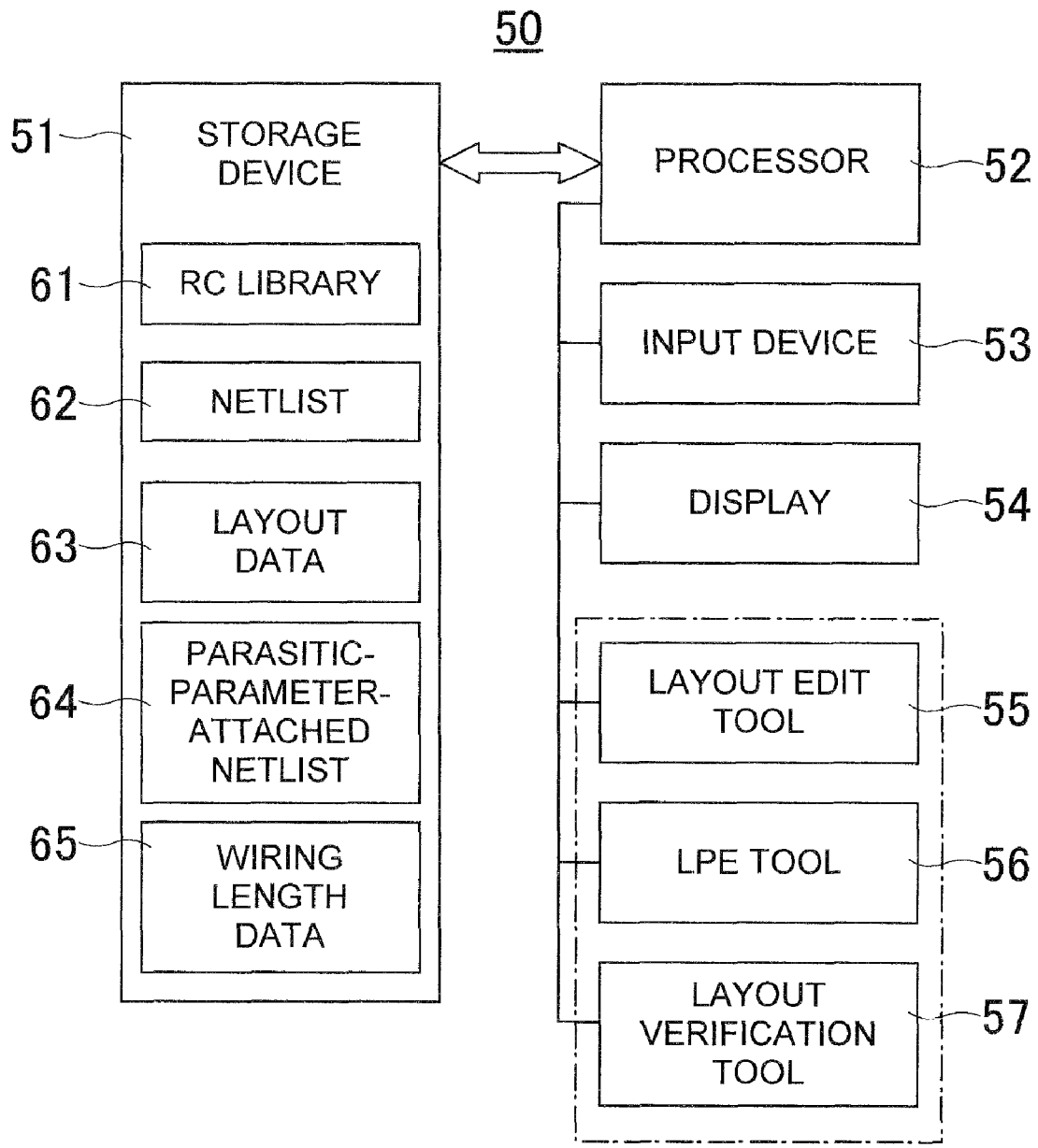
FIG. 5 is a block diagram showing a configuration of a semiconductor device design system according to the present invention.

FIG. 5 is a block diagram showing a configuration of a semiconductor device design system according to the present invention.

As shown in FIG. 5, this semiconductor device design system 50 is achieved by a computer system (CAD: Computer Aided Design), and includes a storage device 51, a processor 52, an input device 53, a display 54, a layout edit tool 55, a parameter extraction tool (LPE tool) 56, and a layout verification tool 57.

The storage device 51 is achieved by a hard disk drive and the like, and is configured to store an RC library 61, a netlist 62, layout data 63, a parasitic-parameter-attached netlist 64, and wiring length data 65. The RC library 61 is referenced at the LPE processing time, and indicates parasitic parameters (RC parameters) of the wiring. The netlist 62 is data indicting a connection relationship of logic elements in a semiconductor device which is being designed. The layout data 63 indicates a layout of the semiconductor device which is being designed. This layout data 63 is prepared by a layout edit too (not shown), and is stored in the storage device 51. The parasitic-parameter-attached netlist 64 is added with a parasitic RC obtained by the LPE processing described later. The wiring length data 65 indicates a wiring length of each wiring in the layout.

The processor 52 can access the storage device 51, and executes various kinds of processing, following instructions from the layout edit tool 55, the LPE tool 56, and the layout verification tool 57. The input device 53 includes a keyboard and a mouse. A user (designer) can input various data and commands using the input device 53, by referencing information displayed in the display 54.

The layout edit tool 55, the LPE tool 56, and the layout verification tool 57 are computer programs (software products) executed by the processor 52.

The layout edit tool 55 includes a function of generating and editing layout data, and can enlarge or move a screen, can add, copy, delete, and move a graphic, and can change a shape. There are broadly two methods of inputting data to the layout edit tool 55. One data input method is inputting an output result of an automatic layout tool (not shown). The layout data is acquired into the layout edit tool 55 via a network or a magnetic medium. In this case, the layout data needs to be converted in advance to a data format that can be accepted by the layout edit tool 55. The other data input method is manual input. The designer inputs a coordinate matrix of a graphic with the mouse, while looking at the display. The edited layout data is stored in the storage device 51. The layout edit tool 55 can assign mask regions. By assigning the mask regions, a virtual wiring layer corresponding to the actual wiring layer can automatically be set, and the wiring part can be converted.

The LPE tool 56 has a function of constructing the RC library 61, and a function of executing the LPE processing to the layout data 63 stored in the storage device 51. The layout verification tool 57 has a function of executing the operation verification (delay verification, timing verification) of a designed circuit. When a design error is found by the layout verification tool 57, the error part is corrected by the layout edit tool 55.

Figure 6:
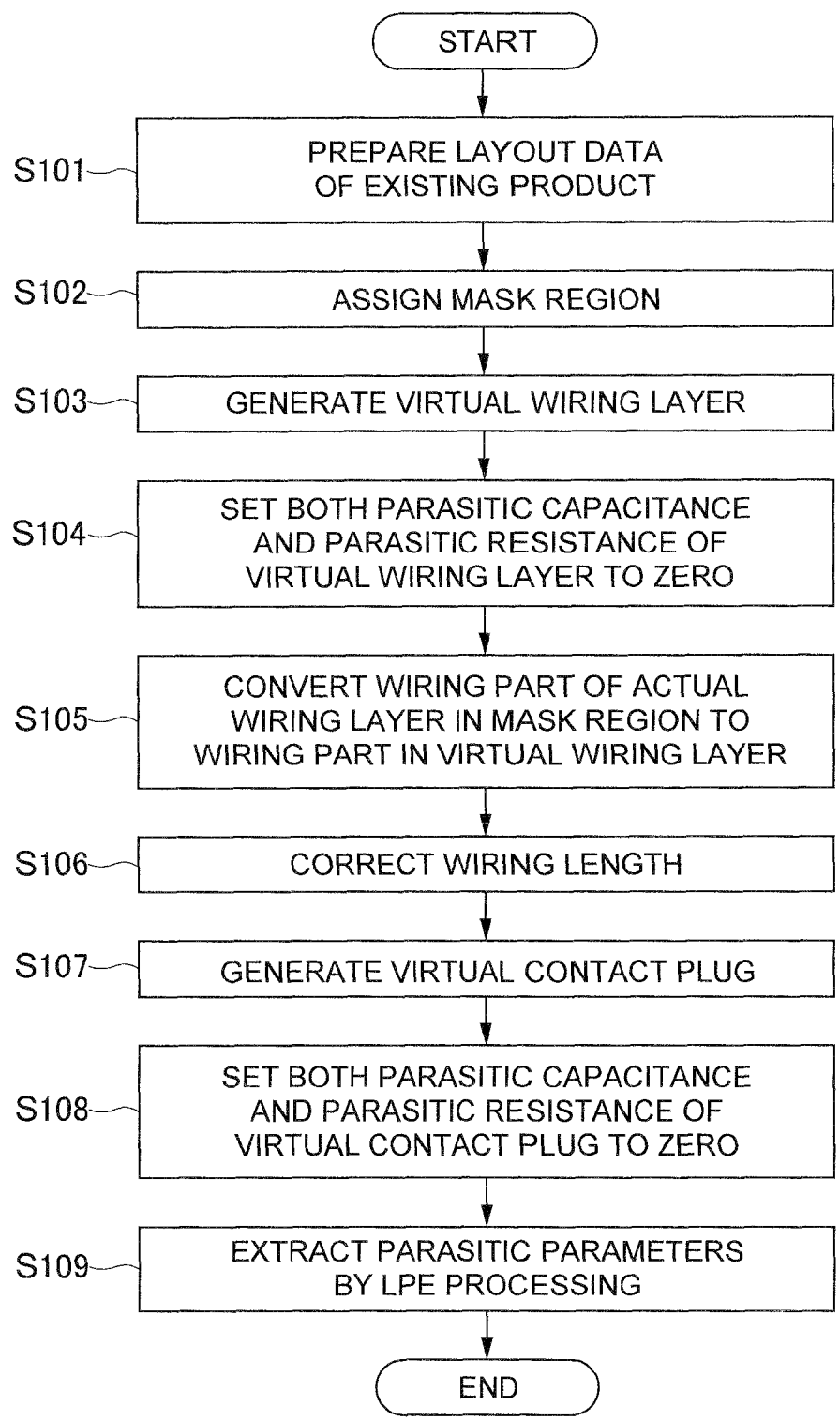
FIG. 6 is a flowchart of a parasitic parameter extraction operation by a semiconductor device design system.

FIG. 6 is a flowchart of the parasitic parameter extraction operation by the semiconductor device design system 50.

As shown in FIG. 6, in the extraction of the parasitic parameters of the miniaturized product, layout data of the existing product (see FIG. 1A) is first prepared, and this layout data is acquired into the layout edit tool 55 (S101). The acquired layout data is displayed on the screen of the display 54.

A mask region which is outside the parasitic parameter extraction region is assigned to the layout data of the existing product (S102). In this case, when an instruction from the user is received, a normal layout edit mode is changed over to a mask region assignment mode, and the mask region can be assigned. A mask region assignment operation is the same as the normal layout edit operation, and a desired range on the layout can be selected and determined, by operating a pointer on the screen.

When the assignment of the mask region is completed, the wiring conversion processing is executed upon receipt of the instruction from the user (S103 to S108). Based on this processing, the wiring part of the actual wiring layer present in the mask region is converted to the wiring part within the virtual wiring layer. The wiring is converted in the manner as explained above with reference to FIG. 3. In other words, the virtual wiring layer corresponding to the actual wiring layer is generated (S103), and the parasitic capacitance and the parasitic resistance of the virtual wiring layer are set to zero (S104). Next, the wiring part of the actual wiring layer present in the assigned mask region is converted to the wiring part in the virtual wiring layer (S105), and then the wiring length correction of extending both ends of the wiring part is performed (S106). Further, the virtual contact plug of a minimum size connecting between both ends of the wiring part with the ends of the disconnected parts of the wiring of the actual wiring layer is generated (S107). The parasitic capacitance and the parasitic resistance of the virtual contact plug are set to zero (S108). Based on the above wiring conversion processing, the wiring of the actual wiring layer is converted to the wiring via the virtual wiring layer.

Thereafter, the LPE processing is executed to the converted layout, thereby extracting the parasitic parameters of either the total layout or a specific part of the layout (S109). The parasitic parameters obtained in this way are used to generate the parasitic-parameter-attached netlist, and are also used for the verification performed by the layout verification tool 57.

As explained above, according to the present embodiment, in designing the circuit layout of the miniaturized product using the circuit layout of the existing product, the virtual wiring layer of which both the parasitic capacitance and the parasitic resistance of the wiring are defined as zero are prepared separately from the actual wiring layer held by the layout of the existing product. The mask region is assigned on the circuit layout of the existing circuit, and the wiring part in this mask region is shifted to the corresponding virtual wiring layer. As a result, the parasitic capacitance and the parasitic resistance of either the total layout or a specific part of the layout of the miniaturized product can be obtained extremely easily. Therefore, the time required for the layout designing to the passing of the verification can be shortened substantially. The development time can be shortened by decreasing the number of times of repeating the designing.

The present invention has thus been shown and described with reference to specific embodiments. However, it should be noted that the present invention is in no way limited to the details of the described arrangements but changes and modifications may be made without departing from the scope of the appended claims.

For example, in the above embodiment, the parasitic capacitance and the parasitic resistance are extracted as the parasitic parameters of the wiring, and the mask region is extracted from the parasitic parameter extraction region. However, the present invention is not limited to the above setting, and one of the parasitic capacitance and the parasitic resistance can be extracted.

As explained above, according to the present invention, at the time of extracting parasitic parameters of the layout of the miniaturized product using the layout data of the existing product, the parasitic parameters can be obtained without designing new layout data having short wiring lengths of a signal line and a power source line. Therefore, efficient layout design can be achieved.

What is claimed is:

1. A design method of a semiconductor device comprising: using a computer to implement steps of:
   a mask region setting step of setting a mask region to a layout of the semiconductor device;
   a parasitic parameter changing step of setting parasitic parameters of a wiring part within the mask region to zero; and
   a parasitic parameter extraction step of extracting parasitic parameters of either the total layout or a specific part of the layout,
   wherein the parasitic parameter changing step includes:
      a virtual wiring layer generation step of generating the virtual wiring layer corresponding to the actual wiring layer of the semiconductor device;
      a parasitic parameter definition step of defining the parasitic parameters of the virtual wiring layer as zero;
      a wiring layer conversion step of converting the wiring part within the mask region of the wiring of the actual wiring layer, to the wiring part of the virtual wiring layer;
      a wiring length correction step of extending the wiring part of the virtual wiring layer by a predetermined length;
      a wiring regeneration step of connecting the end of the wiring part of the virtual wiring layer with the end of a disconnected wiring of the actual wiring layer with a virtual contact plug, thereby providing a continuous wiring; and
      a defining step of defining the parasitic parameters of the virtual contact plug as zero.

2. The design method of a semiconductor device as claimed in claim 1, wherein when plural actual wiring layers are present, the virtual wiring layer generation step generate plural virtual wiring layers corresponding to the respective actual wiring layers.

3. The design method of a semiconductor device as claimed in claim 1, the parasitic parameters is a parasitic capacitance, a parasitic resistance, or both the parasitic capacitance and the parasitic resistance.

4. A semiconductor device design system, comprising:
   a layout edit tool for editing the layout data of the semiconductor device; and
   a parasitic parameter extraction tool for extracting parasitic parameters of either a total layout or a specific part of the layout of the semiconductor device,
   wherein the layout edit tool includes a mask region setting unit that sets a mask region on the layout of the semiconductor device, and a parasitic parameter changing unit that sets the parasitic parameters of a wiring part within the mask region to zero by:
      extending a wiring part of a virtual wiring layer by a predetermined length;
      connecting an end of the wiring part of the virtual wiring layer with an end of a disconnected wiring of an actual wiring layer with a virtual contact plug to provide a continuous wiring; and
      defining the parasitic parameters of the virtual contact plug as zero.

5. A computer-readable storage device storing a program for causing a computer to execute a method, comprising:
   a mask region setting step of setting a mask region on a layout of a semiconductor device;
   a parasitic parameter changing step of setting parasitic parameters of a wiring part within the mask region to zero by extending a wiring part of a virtual wiring layer by a predetermined length, connecting an end of the wiring part of the virtual wiring layer with an end of a disconnected wiring of an actual wiring layer with a virtual contact plug to provide a continuous wiring, and defining the parasitic parameters of the virtual contact plug as zero; and
   a parasitic parameter extraction step of extracting parasitic parameters of either the total layout or a specific part of the layout.

* * * * *